United States Patent
Chiou

(10) Patent No.: US 10,247,629 B2
(45) Date of Patent: Apr. 2, 2019

(54) STACKED OR UNSTACKED MEMS PRESSURE SENSOR WITH THROUGH-HOLE CAP AND PLURALITY OF CHIP CAPACITORS

(71) Applicant: Continental Automotive Systems, Inc., Auburn Hills, MI (US)

(72) Inventor: Jen-Huang Albert Chiou, Libertyville, IL (US)

(73) Assignee: Continental Automotive Systems, Inc., Auburn Hills, MI (US)

(*) Notice: Subject to any disclaimer, the term of this patent is extended or adjusted under 35 U.S.C. 154(b) by 201 days.

(21) Appl. No.: 15/499,639

(22) Filed: Apr. 27, 2017

(65) Prior Publication Data

US 2018/0313709 A1 Nov. 1, 2018

(51) Int. Cl.
*G01L 9/00* (2006.01)
*B81B 3/00* (2006.01)

(52) U.S. Cl.
CPC .......... *G01L 9/003* (2013.01); *B81B 3/0021* (2013.01); *B81B 2201/0264* (2013.01)

(58) Field of Classification Search
None
See application file for complete search history.

(56) References Cited

U.S. PATENT DOCUMENTS

| | | | |
|---|---|---|---|
| 4,314,225 A | 2/1982 | Tominaga et al. | |
| 5,600,071 A * | 2/1997 | Sooriakumar | G01L 9/0055 73/721 |
| 5,852,320 A | 12/1998 | Ichihashi | |
| 7,015,587 B1 * | 3/2006 | Poddar | H01L 23/49575 257/666 |
| 7,298,030 B2 | 11/2007 | McWilliams et al. | |
| 7,598,606 B2 | 10/2009 | Chow et al. | |
| 8,816,453 B2 * | 8/2014 | Zoellin | H04R 19/04 257/416 |
| 9,846,095 B2 * | 12/2017 | Chiou | G01L 9/0042 |
| 2003/0189259 A1 * | 10/2003 | Kurita | H01L 24/27 25/777 |

(Continued)

OTHER PUBLICATIONS

Russell Shumway, High Volume Assembly & Test Solutions to Meet the Rapidly Growing MEMS Market,10th Annual MEMS Technology Symposium, May 23, 2012, San Jose, CA USA, Amkor Technology, 21 pages.

*Primary Examiner* — Peter J Macchiarolo
*Assistant Examiner* — Jermaine L Jenkins

(57) ABSTRACT

A MEMS pressure sensing element and integrated circuit (IC) are mounted on a circuit board. The sensing element and IC can be either stacked or unstacked. Bond wires connect the IC to the circuit board. Other bond wires connect the sensing element to the IC. A cap covers the sensing element and IC. The cap is attached to the circuit board and has a small hole in it, through which viscous gel is inserted. The gel encapsulates the MEMS sensing element, IC and bond wires in the cap. The hole also allows pressurized fluid to enter the cap and exert force on the MEMS pressure sensing element after encapsulation in the gel. Chip capacitors can also be mounted on the circuit board, outside the cap. Electrical signals are generated, which represent pressure applied to the MEMS pressure sensing element through the hole and gel.

23 Claims, 12 Drawing Sheets

(56) References Cited

U.S. PATENT DOCUMENTS

| | | | |
|---|---|---|---|
| 2008/0083958 A1* | 4/2008 | Wei | B81B 7/0064 257/415 |
| 2010/0019393 A1* | 1/2010 | Hsieh | B81C 1/0023 257/777 |
| 2016/0159642 A1* | 6/2016 | Hooper | B81B 7/0061 257/419 |
| 2016/0297671 A1* | 10/2016 | Pahl | B81B 7/0048 |
| 2017/0343430 A1* | 11/2017 | Caltabiano | G01L 1/18 |

* cited by examiner

US 10,247,629 B2

STACKED OR UNSTACKED MEMS PRESSURE SENSOR WITH THROUGH-HOLE CAP AND PLURALITY OF CHIP CAPACITORS

BACKGROUND

FIG. 1 is an exploded view of a prior art absolute microelectromechanical system (MEMS) pressure sensor 100. The absolute MEMS pressure sensor 100 comprises a plastic housing 102 having a port 104 that conducts pressurized fluid, typically a liquid, to an absolute MEMS pressure sensing element 106 located inside a pocket (or cavity) 108. The pocket 108 is located inside the plastic housing 102.

The pocket 108 holds the absolute MEMS pressure sensing element 106 and an application specific-integrated circuit (ASIC) 112. The absolute MEMS pressure sensing element 106 and the ASIC 112 are connected by thin bond wires 118. Different bond wires 116 connect the ASIC 112 to conductive lead frames 114. Chip capacitors 120 located outside the pocket 108 are connected across lead frames 114 and suppress electromagnetic interference. Electrical signals are provided to and received from the ASIC 112 through the metal "lead frames" 114, which extend through the plastic housing 102 up to the pocket 108.

Both the absolute MEMS pressure sensing element 106 and the ASIC 112 are encapsulated by a layer of viscous gel 110 inside the pocket 108. The gel 110 also protects the small-diameter bond wires 118 that conduct signals between components.

FIG. 2 is a cross-sectional view of the prior art absolute MEMS pressure sensor 100 shown in FIG. 1. The absolute pressure sensor module 100 comprises the absolute MEMS pressure sensing element 106 on top of a substrate or pedestal 202, which is mounted on the top side 207 of a housing substrate 204 using a thin layer of a pliable adhesive 206, typically silicone.

The absolute MEMS pressure sensing element 106 comprises a vacuumed cavity 210 formed between a thin diaphragm 205 and the substrate 202, which supports the absolute MEMS pressure sensing element 106. As is known, the diaphragm 205 deflects when pressure is applied to the diaphragm 205 through the gel 110. As is known, the deflection creates (changes) stress on a resistive Wheatstone bridge circuit (not shown) formed in the diaphragm 205. When a voltage is input to the Wheatstone bridge circuit, its output voltage changes responsive to the diaphragm's deflection thus converting the diaphragm's deflection into a measurable voltage change.

Both the ASIC 112 and the absolute MEMS pressure sensing element 106 are mounted to the housing substrate 204 using a pliable adhesive 206. A chip capacitor 120 connected between the lead frame 114 and a reference potential such as a ground (not shown) shunts undesirable high frequency noise signals to the reference potential.

Viscous gel 110 inside the pocket protects the pressure sensing element 106, the ASIC 112 and the bond wires from media contamination. Unfortunately, the gels used to protect components of a MEMS pressure sensor are expensive. Reducing the amount of gel required to cover and protect fragile components would be an improvement over the prior art.

DETAILED DESCRIPTION

As used herein, the noun form of "stack" refers to at least two components, one of which is placed on top the other. Two or more "stacked" components are thus arranged such that one component has one or more other components on top of it, regardless of whether the components are held in place relative to each other. Stacked components need not be the same type, size, shape, thickness or weight. For structural stability and easier wire bonding, the component stacked on the top is usually smaller.

"Un-stacked" components are simply two or more components that are not arranged with one or more of them on top of another component. Un-stacked components are components that are side-by-side on a circuit board, regardless of their separation distance, type, size, shape, thickness or weight.

Figure 3:
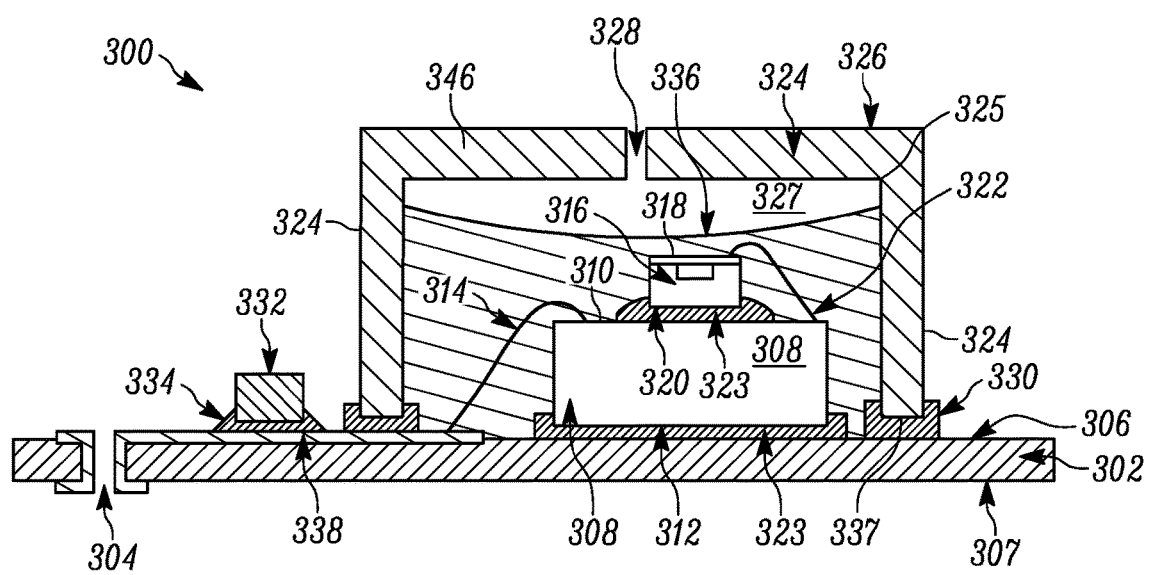
FIG. 3 is a cross-sectional view of a first-level absolute pressure sensor packaging with a MEMS pressure sensing element stacked on an ASIC.

Referring now to FIG. 3, a first-level absolute pressure sensor packaging 300 comprises an absolute MEMS absolute pressure sensing element 316 stacked on an ASIC 308, which is mounted on a conventional circuit board 302. The circuit board 302 has a top surface 306 and an opposing bottom surface 307. Conductive vias 304 extend through the circuit board 302 and provide electrical connection nodes on both the circuit board's top surface 306 and bottom surface 307. The vias 304 are essentially holes through the circuit board 302, the inside surfaces of which are coated with metal.

An ASIC 308 is attached to the top surface 306 of the circuit board 302 by a thin layer of a pliable adhesive 323, preferably silicone. The adhesive 323 is "sandwiched" between the top surface 306 of the circuit board 302 and a bottom surface 312 of the ASIC 308. Silicone is known to remain pliable relative to the ASIC 308 and the circuit board 302 after curing. It thus reduces thermally-mismatched stress on the ASIC 308 that might arise due to differences between the thermal expansion coefficients of the ASIC and the circuit board.

Small-diameter bond wires 314 extend between electrical contact surfaces (not shown) on the top surface 310 of the ASIC 308 and electrical contact surfaces or "traces" 338 deposited onto the top surface 306 of the circuit board 302. Those bond wires 314 thus enable signals and power supply voltages to be carried between the conductive metal traces 338 on the top surface 306 of the circuit board 302 and the ASIC 308.

Still referring to FIG. 3, the absolute MEMS pressure sensing element 316 having an upper surface 318 and an opposing bottom surface 320 is attached to the top surface 310 of the ASIC 308 by a second layer of adhesive 323, also silicone, located between the bottom surface 320 of the absolute MEMS pressure sensing element 316 and the top surface 310 of the ASIC 308. Stated another way, the absolute MEMS pressure sensing element 316 is stacked on top of the ASIC 308, reducing the circuit board surface area that would otherwise be required to mount both of the devices, 316, 308, side-by-side on the circuit board. It also enables the size of a housing for the absolute MEMS pressure sensor to be reduced.

In addition to reducing the circuit board surface area required to mount two devices side-by-side and reducing the size or volume of a housing, stacking the MEMS pressure sensing element 316 on top of the ASIC 308 also reduces thermal stress on the absolute MEMS pressure sensing element 316 that it would experience if the absolute MEMS pressure sensing element 316 were to be attached directly to the circuit board 302. In other words, stacking the absolute MEMS pressure sensing element 316 on the ASIC 308 isolates the absolute MEMS pressure sensing element 316 from thermally induced stress caused by differences in the thermal expansion coefficients of the ASIC 308 as well as the circuit board 302.

In addition to the bond wires 314 that electrically connect the ASIC 308 to conductive traces 338 on the circuit board 302, a second set of small-diameter bond wires 322 extends between conductive pads on the top surface 318 of the MEMS pressure sensing element 316 and the top surface 310 of the ASIC 308. The second set of bond wires 322 thus electrically connect the devices 308, 316 to each other and enable electrical signals to be carried between the absolute MEMS pressure sensing element 316 and the ASIC 308.

The ASIC 308, bond wires 314 and 322 and the absolute MEMS pressure sensing element 316 are enclosed within an electrically conductive cap 324, i.e., a cap 324 preferably made of metal. The cap 324 confines the absolute MEMS pressure sensing element 316, the ASIC 308 and the bond wires in an electrically conductive "shell," which provides both physical protection to the devices inside and which also suppresses electromagnetic interference (EMI) inside the cap 324. The cap 324 thus acts as a "Faraday shield."

The cap 324 defines an open interior volume or space 327. The interior space 327 is partially filled with a viscous gel 336 after the cap 324 is placed over the ASIC 308, bond wires 314 and 322 and the absolute MEMS pressure sensing element 316. For claim construction purposes, "partially filled" should be construed as completely covering the components inside the cap as well as partially covering those same elements. By way of example, a partially filled cap would include completely covering the ASIC and the MEMS pressure sensing element but not necessarily covering the bond wires completely. In other words, the opposing ends of a bond wire could be covered by the gel but portions of a bond wire between its respective ends would be uncovered, i.e., not covered by the gel.

The gel 336 is added into the open space 327 inside the cap 324 through an orifice 328 in the top surface 326 of the cap 324. The particular gel 336 used in the cap 324 is selected to be able to transmit pressure to a diaphragm formed into the top surface 318 of the MEMS sensing element 316 and protect the components inside the cap 324 from media contamination. The cap 324 is also used to isolate stresses transferred from materials surrounding the outside of the cap 324 such as epoxy 702 in FIG. 7 or overmold 802 in FIG. 8 to ensure pressure sensing accuracy.

The volume of the open interior 327 of the cap 324 determines the amount of gel 336 required to cover the components in the cap 324. The shape and dimensions of the cap 324 are thus selected to minimize the gel 336 required to cover components in the cap 324 without completely filling the open interior volume 327.

The gel 336 is a viscous, non-conductive liquid having a viscosity between about 100 centipoises (cP) up to about 100,000 cP with a very low mechanical modulus. For a relative comparison, water has a viscosity of 1 cP.

In a preferred embodiment the cap 324 is considered to be a short, hollow cylinder having two opposing ends, one end of which is closed, except for an orifice in the closed end through which gel is dispensed into the cap 324. The bottom end 327 is considered herein to be the end of a hollow cylinder closest to the top surface 306 of the circuit board 302. The bottom end 327 is attached to the circuit board 302 by an annulus-shaped layer of epoxy or solder 330 that extends completely around the perimeter of the hollow cylinder. The epoxy or solder 330 is important: it affixes the cap 324 to the circuit board 302 and prevents gel 336 from leaking out of the cap 324.

Alternate and functionally equivalent embodiments of the cap 324 include short, hollow tubes having different cross sectional shapes including but not limited to an ellipse and a rectangle. The terms, cylinder and hollow cylinder should thus be construed as including short, hollow enclosures having cross sectional shapes which can be round, elliptical, triangular or rectangular. The term "cap" should thus be construed to include all such hollow enclosures as long as one end is covered with a plate having an orifice, regardless of the orifice area, the other end of which is open allowing the cap enclosure to fit over a MEMS pressure sensing element and an ASIC, and be affixed using an epoxy or other similar adhesive, regardless of whether the MEMS sensing element and ASIC are stacked together or located alongside each other.

In the figures, the top end 325 of a short hollow cylindrical tube is "covered" or "closed" by a thin metal circular plate 346. Closing the tube thus defines a cap 324.

The thin metal circular plate 346 defines a top surface 326 of the cap 324. The top surface 326 is provided with an orifice 328, sized and shaped to allow an appropriate gel 336 to be dispensed into the cap 324 from a small needle.

In the preferred embodiment, the gel 336 covers the bond wires as well as the MEMS pressure sensing element mounted on top of the ASIC. Importantly, the gel 336 does not fill the interior 327 of the cap 324. An open space or void is instead maintained above the top surface of the gel 336. Completely filling the interior 327 would otherwise cause a thermal mismatch between the gel 336, the cap 324 and the absolute MEMS pressure sensing element 316.

Those of ordinary skill in the art should recognize that the interior volume 327 of the cap 324 determines the amount of gel 326 required to encapsulate the bond wires 314, 322, the ASIC 308 and the absolute MEMS pressure sensing element 316. Minimizing the diameter of the cap 324 and minimizing the height of the cap minimizes the volume of gel 336 required to cover the components inside the cap 324.

Still referring to FIG. 3, signal-carrying metal traces 338 on the top surface 306 of the circuit board 302 are capacitively coupled to a ground or other reference potential (not shown) by "chip" capacitors 332. The chip capacitors 332 shunt electrical noise (i.e., electromagnetic interference or "EMI") to ground or other reference potential.

Chip capacitors do not require protection provided by a gel. The chip capacitors 332 are thus preferably located outside the cap 324. Because of the reduced foot print required of an absolute MEMS sensing element stacked on an ASIC, however, the chip capacitors can be located inside a housing pocket as a design choice, such as the pocket 108 shown in FIG. 1, instead of outside the pocket as FIG. 1 also shows.

Still referring to FIG. 3, metal traces 338 on the top surface of the circuit board 302 extend from inside the cap 324 to conductive vias 304. Electrical pins, not shown in FIG. 3, are size and shaped to fit into the vias 304 and allow wires to be electrically connected to the traces 338. The chip capacitors 332 are attached to the metal traces 338 by solder 334 or an electrically conductive adhesive 334.

Figure 4A:
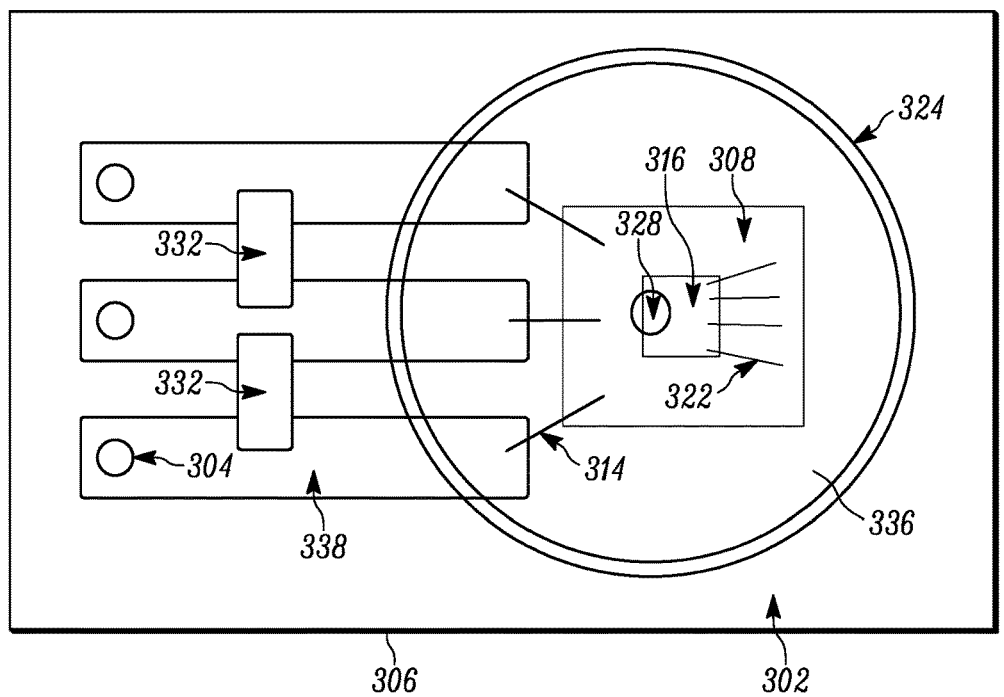
FIG. 4A is a top view of a portion of a circuit board supporting the first-level absolute pressure sensor packaging shown in FIG. 3.
Figure 4B:
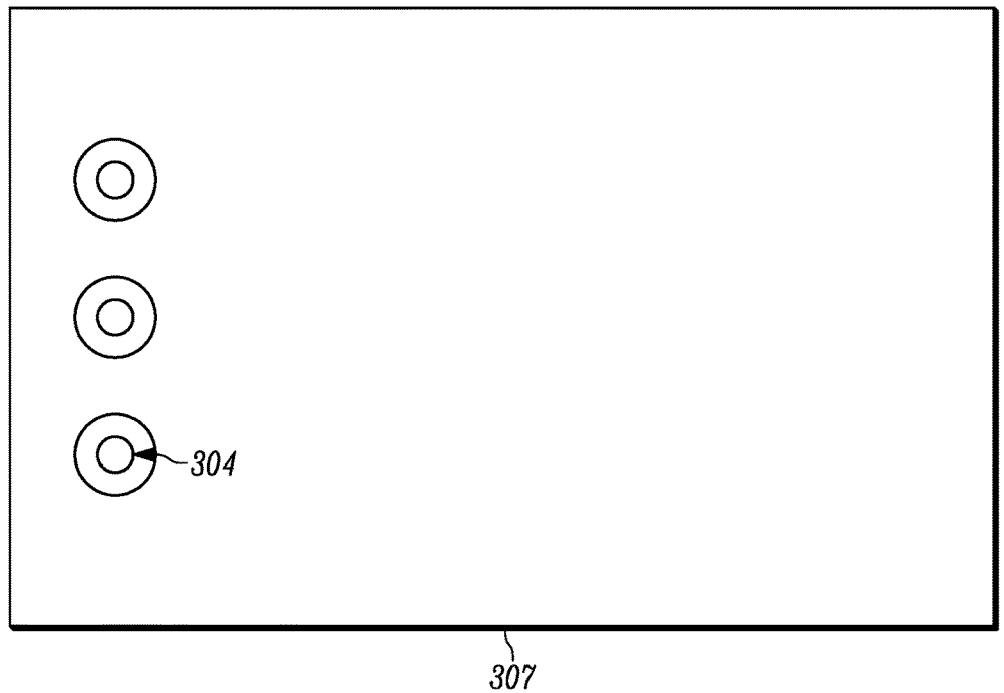
FIG. 4B is a bottom view of the circuit board shown in FIG. 4A.

FIG. 4A is a top view of the circuit board shown in FIG. 3. FIG. 4A also shows how the cap 324 covers the ASIC 308, above which is the MEMS pressure sensing element 316. Bond wires 322 can be seen extending from the absolute MEMS pressure sensing element 316 to the top surface 310 of the ASIC 308. Other bond wires 314 extend from the top surface 310 of the ASIC 308 to the metal traces 338 to which are attached small chip capacitors 332. FIG. 4B is a bottom view of the circuit board 302 showing its bottom surface 307.

Figure 5:
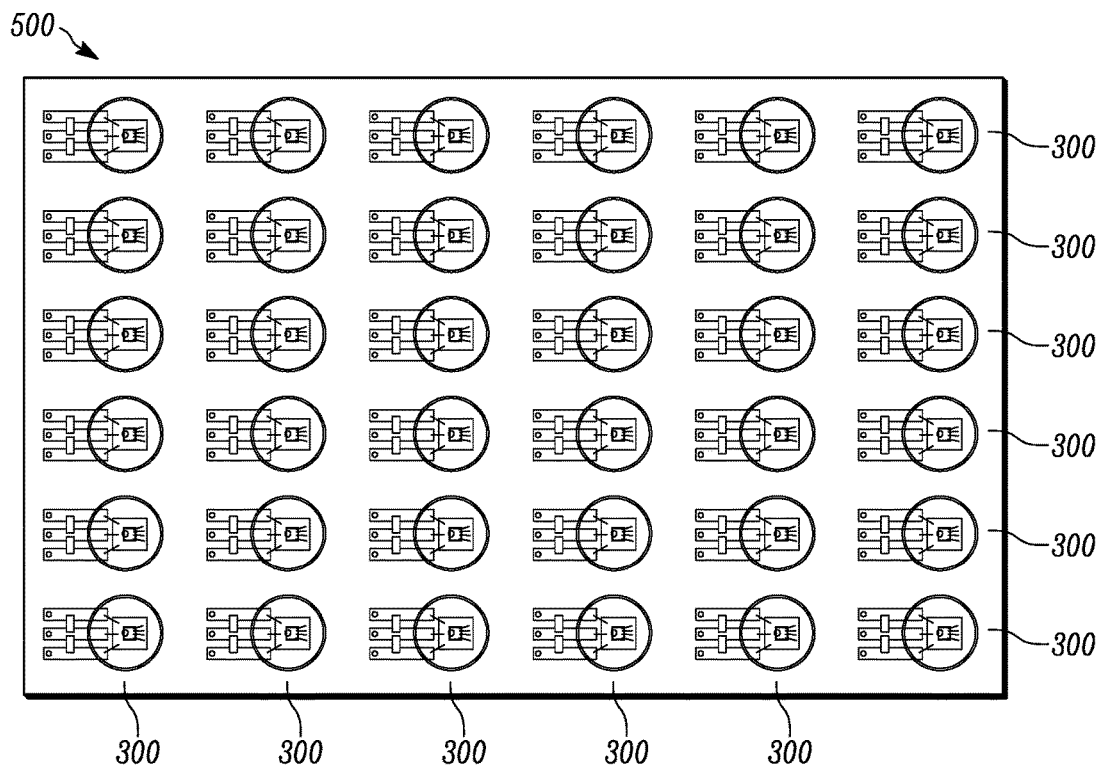
FIG. 5 is a top view of a larger portion of the circuit board shown in FIG. 4A showing several first-level absolute pressure sensor packagings mounted on it for synchronized calibration.

FIG. 5 is a portion of a larger circuit board 500 which can be a printed circuit board (PCB) or a ceramic circuit board made of a conventional material. Several absolute pressure sensors 300 formed onto the circuit board 500 are manufactured together. They are also calibrated together, after which the circuit board 500 is diced or cut in order to separate the individual absolute pressure sensors 300 from each other.

Figure 6:
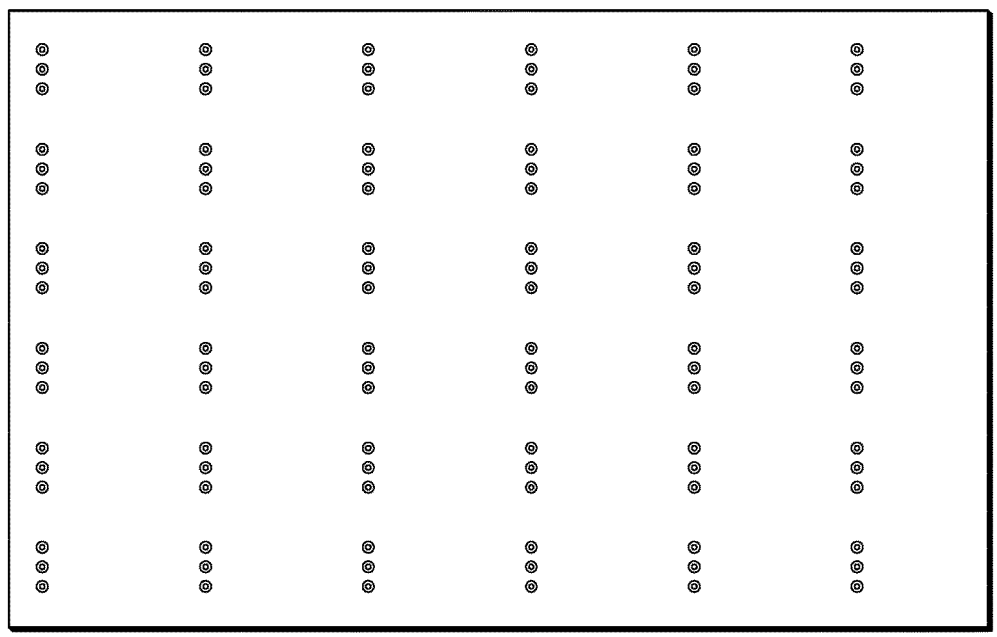
FIG. 6 is a bottom view of the circuit board shown in FIG. 5.

FIG. 6 is simply a bottom view of the circuit board 500 shown in FIG. 5. The several connections on the bottom side of the circuit board enable the multiple pressure sensors on the top side of the circuit board to be calibrated together, saving calibration time and reducing manufacturing cost.

Figure 1:
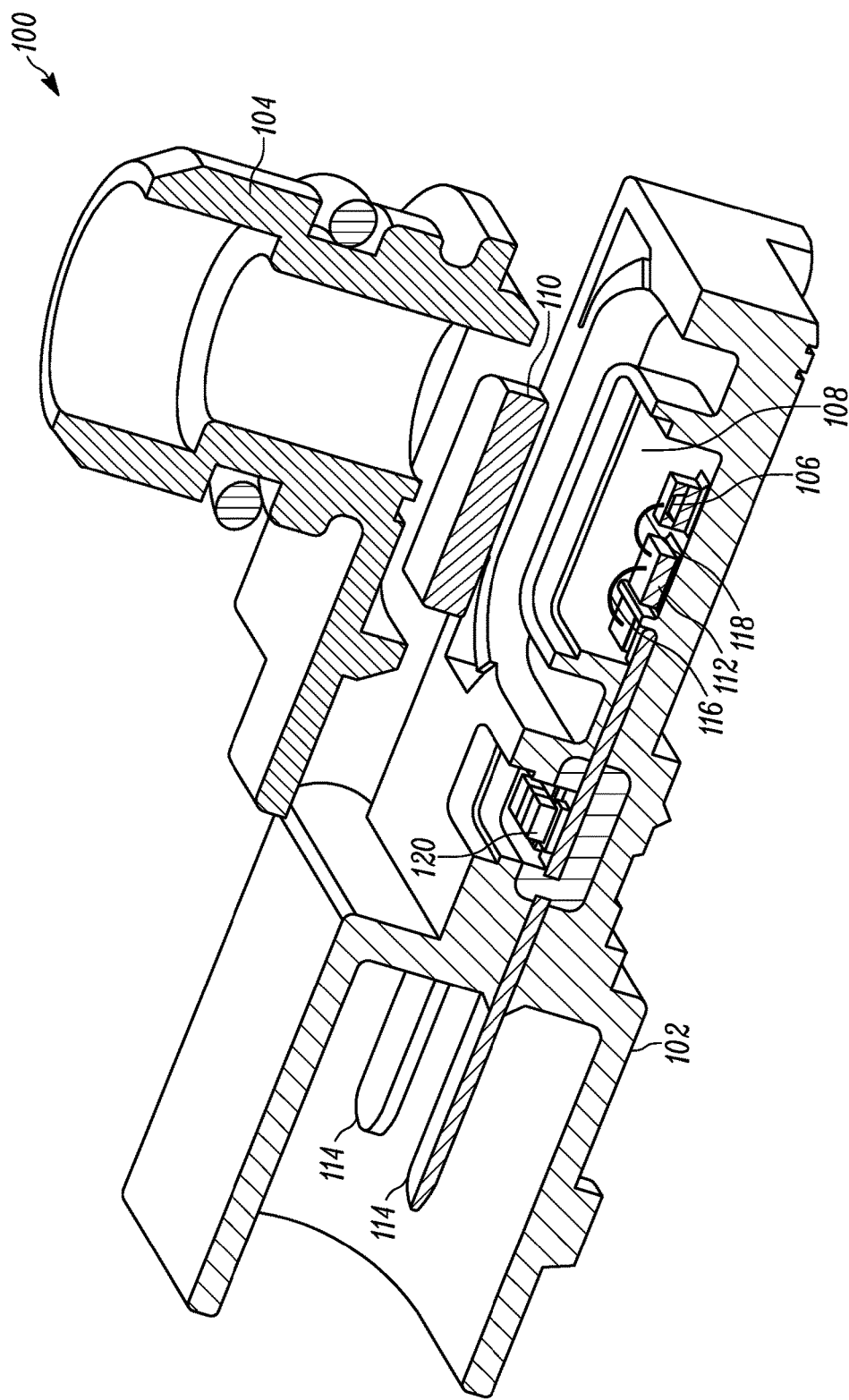
FIG. 1 is an exploded view of a prior art absolute MEMS pressure sensor.
Figure 2:
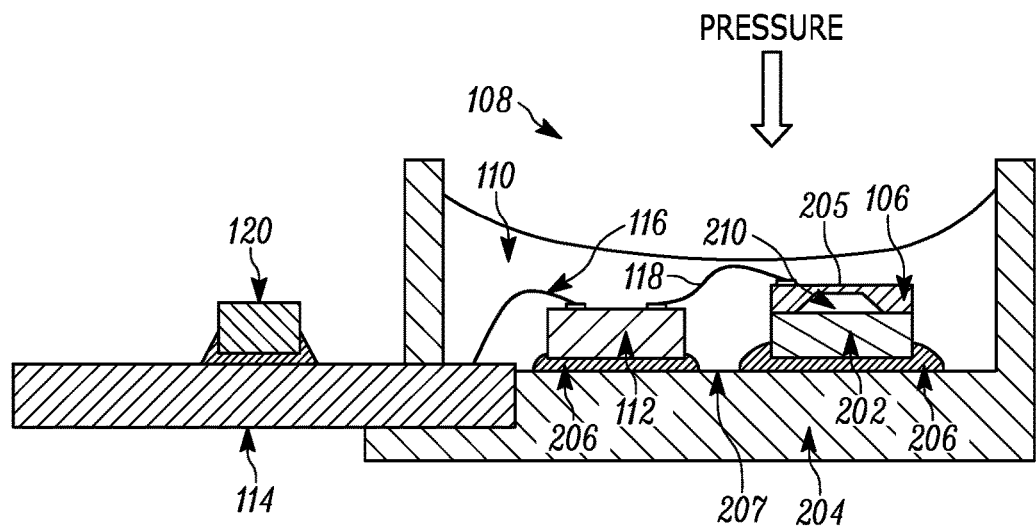
FIG. 2 is a cross-sectional view of portion of the prior art absolute MEMS pressure sensor.
Figure 7:
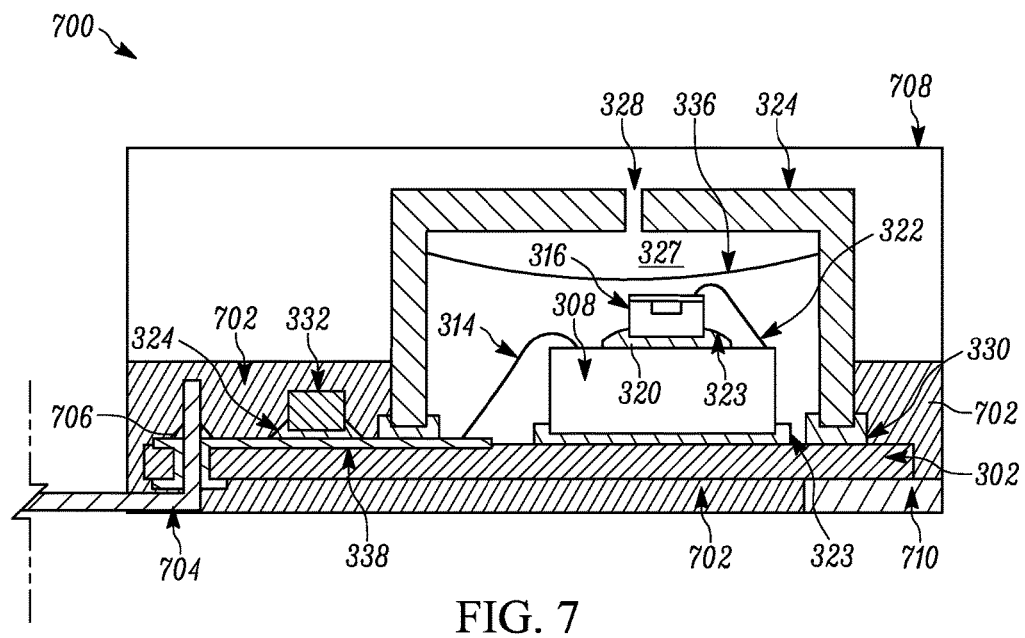
FIG. 7 is a cross-sectional view of a calibrated first-level stacked absolute pressure sensor packaging mounted in a pocket of a plastic housing to form an absolute pressure sensor.

FIG. 7 is a cross-sectional view of one of the calibrated first-level absolute pressure sensor packagings 300 singulated from the circuit board 500 in FIG. 5 and mounted in a pocket of a shortened and simplified plastic housing (not shown) to form an absolute pressure sensor. The shortened and simplified plastic housing is similar to the plastic housing as shown in FIG. 1 but without the portion to accommodate the chip capacitors 120 in a well since the chip capacitors have been placed on the circuit board 302 outside of the cap 324 as depicted in FIG. 3 and will be located with the circuit board 302 into the pocket. The angled connector pins 704 are electrically connected to the vias 304 of the circuit board 302 of the calibrated first-level absolute pressure sensor packaging 300 using either solder or an electrically conductive adhesive 334. The circuit board rests on a plastic stand 710 that extends up from the bottom of a housing pocket 708 in which the calibrated first-level absolute pressure sensor packaging 300 is mounted.

The epoxy 702 and the soldered angled connector pins 704 constrain movement of the first-level absolute pressure sensor packaging 300. The epoxy 702 also further constrains movement of a pre-molded, angled pins 704 that extend upwardly through vias 304 in a second-level packaging.

Figure 8:
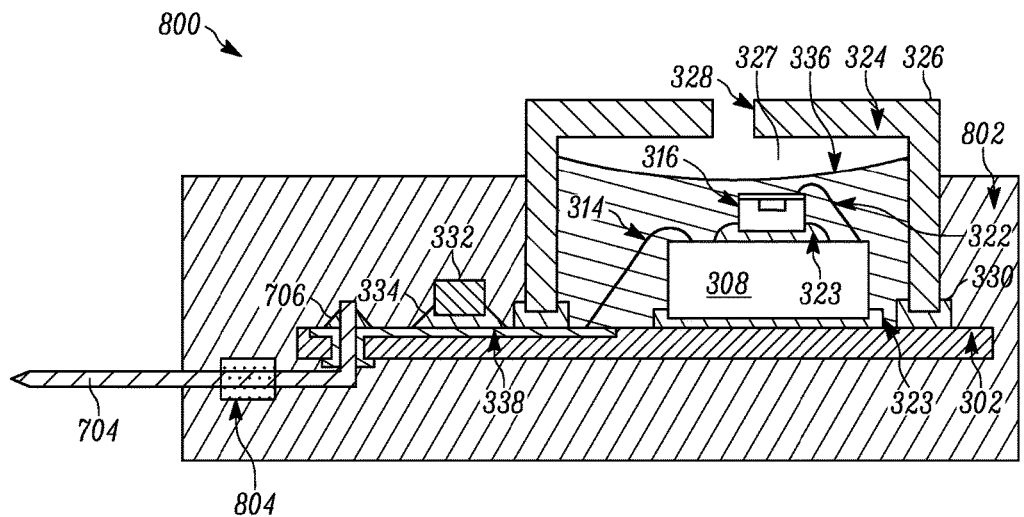
FIG. 8 is a cross-sectional view of an alternate embodiment of an absolute pressure sensor formed in part by overmolding a calibrated stacked first-level absolute pressure sensor packaging.

FIG. 8 is a cross-sectional view of an alternate embodiment of an absolute pressure sensor formed by overmolding one of the calibrated first-level absolute pressure sensor packagings 300 singulated from the circuit board in FIG. 5. The embodiment shown in FIG. 8 differs from the embodiment shown in FIG. 7 by the partial embedment of the cap 324 in a plastic over mold 802. More particularly, the over mold 802 does not extend over the cap's top surface 326. The angled connector pins 704 are electrically connected to the vias 304 of the circuit board 302 of the calibrated first-level absolute pressure sensor packaging 300. The angled connector pins 704 are pre-molded by pre-mold 804. As with the epoxy layer 702 shown in FIG. 7, the over mold 802 constrains movements of the pre-molded angled pins 704 and the calibrated first-level absolute pressure sensor packaging 300 to form an absolute pressure sensor in a second-level packaging without a pre-formed plastic housing.

Figure 9:
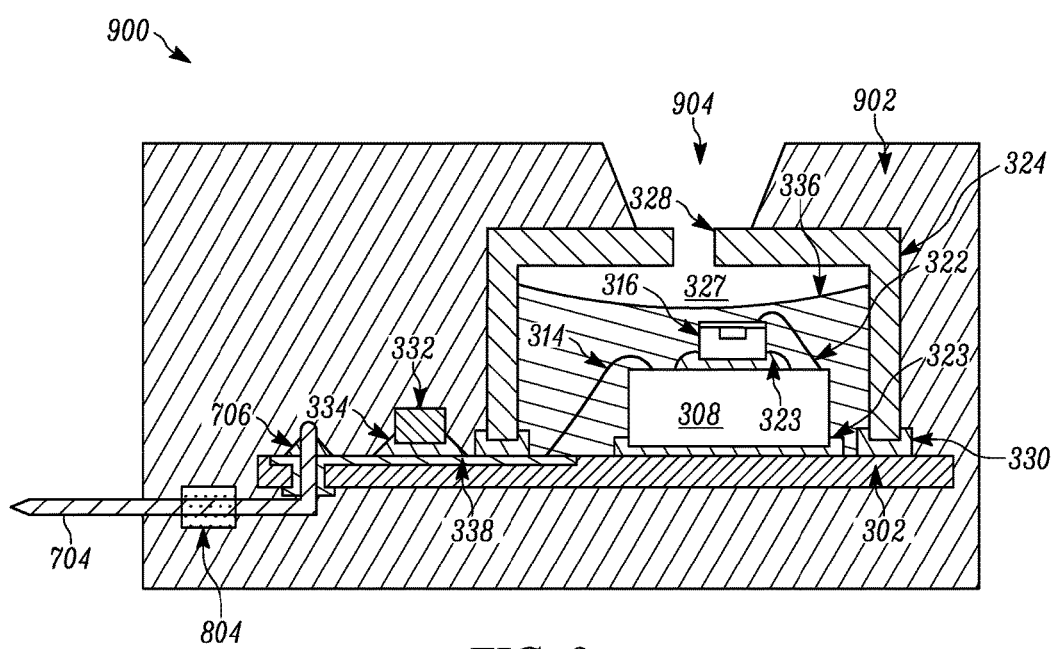
FIG. 9 is another alternate embodiment cross-sectional view of a stacked overmolded absolute pressure sensor.

FIG. 9 is a cross-sectional view of yet another alternate embodiment of an absolute pressure sensor 900 in a second-level packaging. The structure shown in FIG. 9 differs from that shown in FIG. 8 by an overmold 902 that extends over the top surface 326 of the cap 324 but which does not cover the orifice 328. When the over mold 902 material is applied to the circuit board 302 and over the cap 324, it is held away from the orifice 328 by a form or "shut-off" that holds back the over mold material 902 until the material 902 cures or solidifies. A funnel-shaped opening 904 in the over mold 902 allows pressurized fluid to enter the orifice 328 to reach the top side of the absolute MEMS pressure sensing element for pressure sensing.

Figure 10:
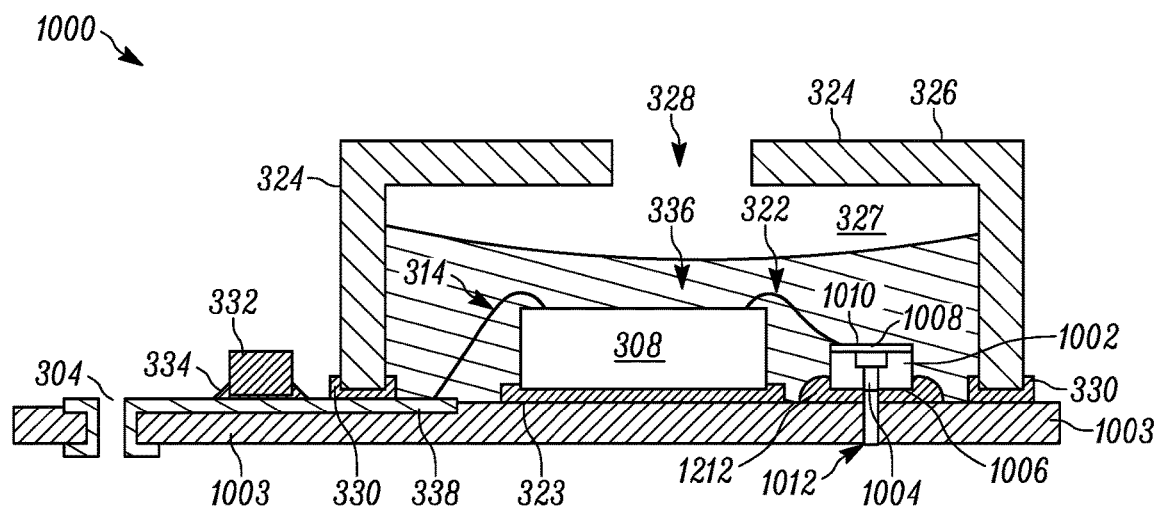
FIG. 10 is a cross-sectional view of a first-level un-stacked differential pressure sensor packaging.

FIG. 10 is a cross-sectional view of a first embodiment of a first-level differential pressure sensor packaging 1000. The differential pressure sensor packaging 1000 comprises a differential MEMS pressure sensing element 1002 and an ASIC 308 covered by a cap 324. As with the first-level absolute pressure packaging 300 shown in FIG. 3, a gel 336 partially fills the interior 327 of the cap 324. The gel 336 is flowed into the cap 324 through the orifice 328 in the top surface 326.

The differential MEMS pressure sensing element 1002 differs from the absolute MEMS pressure sensing element 316 shown in FIG. 3 by a backside hole 1004 that extends upwardly from the back side 1006 of the differential MEMS pressure sensing element 1002 upwardly to the diaphragm 1008 formed on the opposing top side 1010.

The hole 1004 of the differential MEMS pressure sensing element 1002 is aligned with a hole 1012 that extends through a circuit board 1003. The circuit board hole 1012 allows fluid pressure to be applied to the back side of the diaphragm 1008 via the hole 1004 at the same time top side pressure is applied to the top side of the diaphragm 1008 through the orifice 328. Deflection of the diaphragm 1008 in the differential MEMS pressure sensing element 1002 is thus determined by the difference between the top side pressure and back side pressure.

Figure 11:
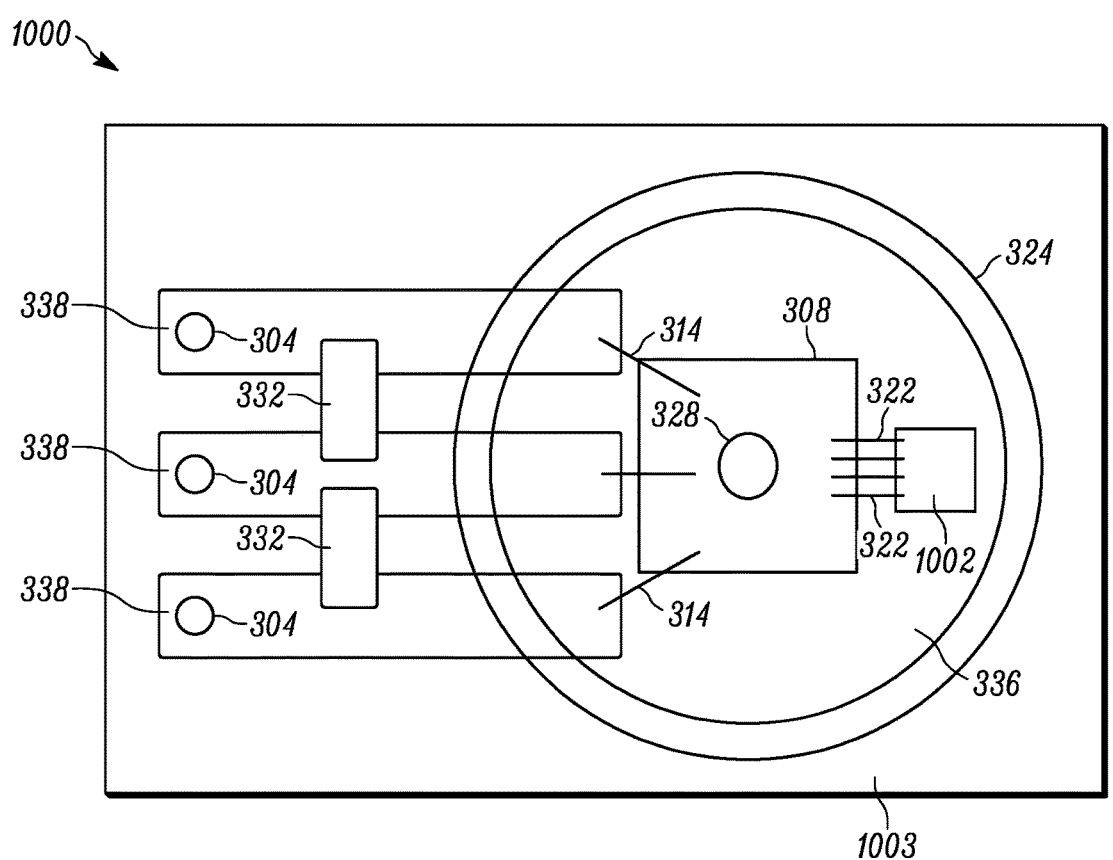
FIG. 11 is the top view of a portion of a circuit board supporting the first-level un-stacked differential pressure sensor packaging shown in FIG. 10.

FIG. 11 is simply a top view of the circuit board 302 supporting the differential pressure sensor 1000 shown in FIG. 10. The differential MEMS pressure sensing element 1002 can be seen to be offset from the ASIC 308 and connected to the ASIC 308 by small-diameter bond wires 322.

Figure 12:
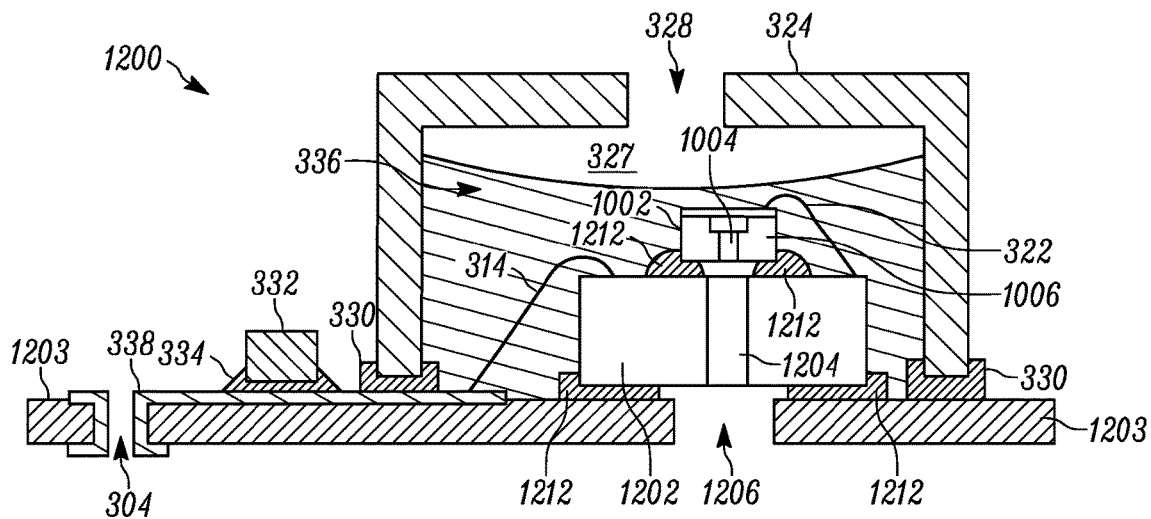
FIG. 12 is a cross-sectional view of an embodiment of a first-level stacked differential pressure sensor.

FIG. 12 is a cross-sectional view of another embodiment of a first-level differential pressure sensor packaging 1200. An ASIC 1202 having a through hole 1204 is mounted on a circuit board 1203 with a thin square-annulus-shaped layer 1212 of a pliable adhesive surrounding an hole 1206 through the circuit board 1203. A differential MEMS pressure sensing element 1002 is then mounted on top of an ASIC 1202. The ASIC, however, is specifically formed to include the hole 1204 through which fluid pressure can be applied to the back side of the differential pressure sensing element 1002 stacked on top of the ASIC 1202. The hole 1204 through the ASIC 1202 is located over and aligned with the hole 1004 formed in the backside 1006 of the differential MEMS pressure sensing element 1002, as well as a hole 1206 that extends through a circuit board 1203. Pressure applied to the back side of the circuit board is thus applied to back side of the diaphragm 1008 formed in the MEMS differential pressure sensing element 1002.

The differential MEMS pressure sensing element 1002 is stacked on the ASIC 1202 by a thin square-annulus-shaped layer 1212 of a pliable adhesive, preferably a silicone adhesive. The adhesive layer 1212 surrounds but cannot not cover or block the hole 1204.

The first-level differential pressure sensor packaging 1200 produces an output signal at the via 304, proportional to the difference between the pressure applied to the diaphragm 1008 through the orifice 328 and the pressure applied through the bottom hole 1206 of the circuit board 1203.

Figure 13:
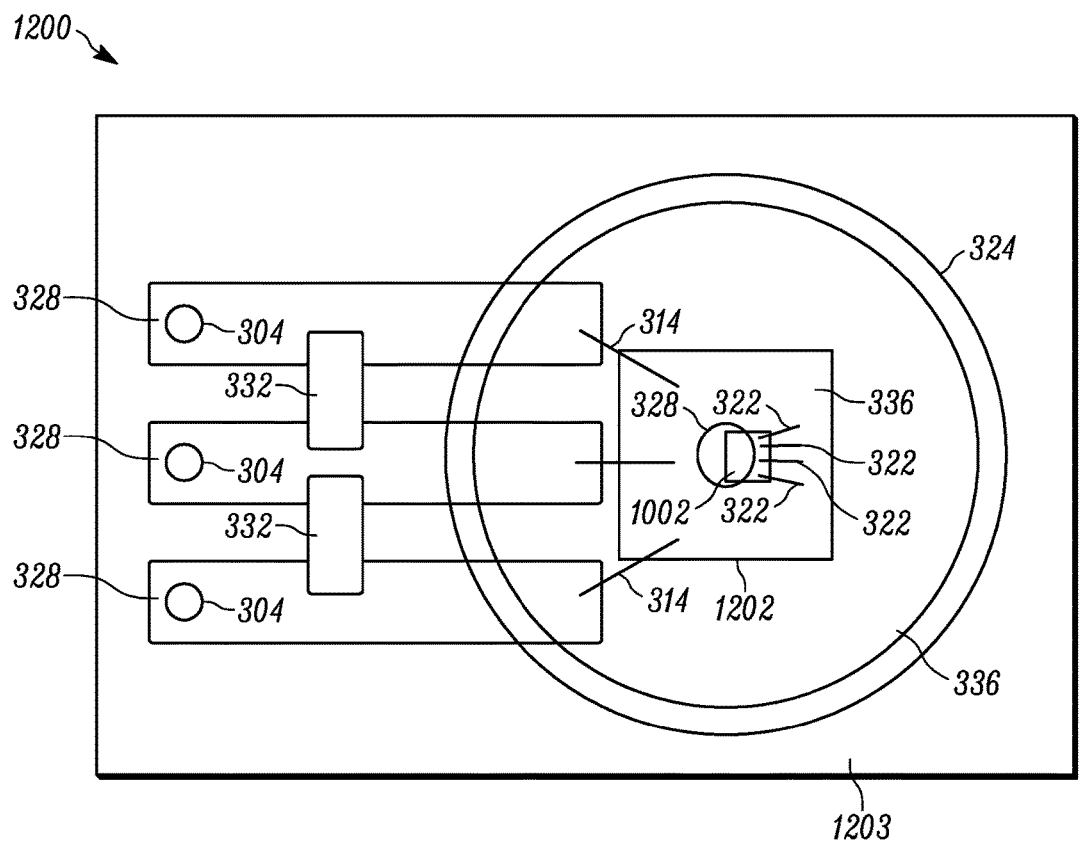
FIG. 13 is a top view of a portion of a circuit board supporting the first-level stacked differential pressure sensor packaging shown in FIG. 12.

FIG. 13 is simply a top view of the circuit board 1203 showing the differential MEMS pressure sensing element 1210 stacked on top of the ASIC 1202.

Figure 14:
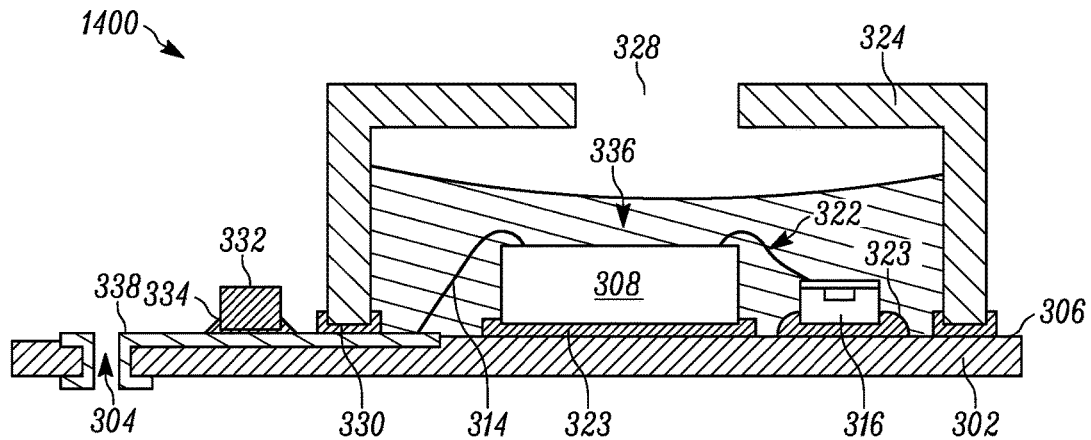
FIG. 14 is a cross-sectional view of an alternate embodiment of a first-level un-stacked absolute pressure sensor packaging.

FIG. 14 is a cross-sectional view of another embodiment of an first-level absolute pressure sensor packaging 1400. The embodiment shown in FIG. 14 differs from the embodiment shown in FIG. 3 by the location of the absolute MEMS pressure sensing element 316 on the circuit board 302 instead of being stacked on top of the ASIC 308. The absolute MEMS sensing element 316 is affixed to the top surface 306 of the circuit board 302 using a thin layer of silicone adhesive 323 applied directly to the top surface 306 of the circuit board 302. As with the embodiment shown in FIG. 3, thin bond wires 322 connect the absolute MEMS pressure sensing element 316 to the ASIC 316. Pressure is also applied to the absolute MEMS pressure sensing element 316 through the orifice 328.

Figure 15:
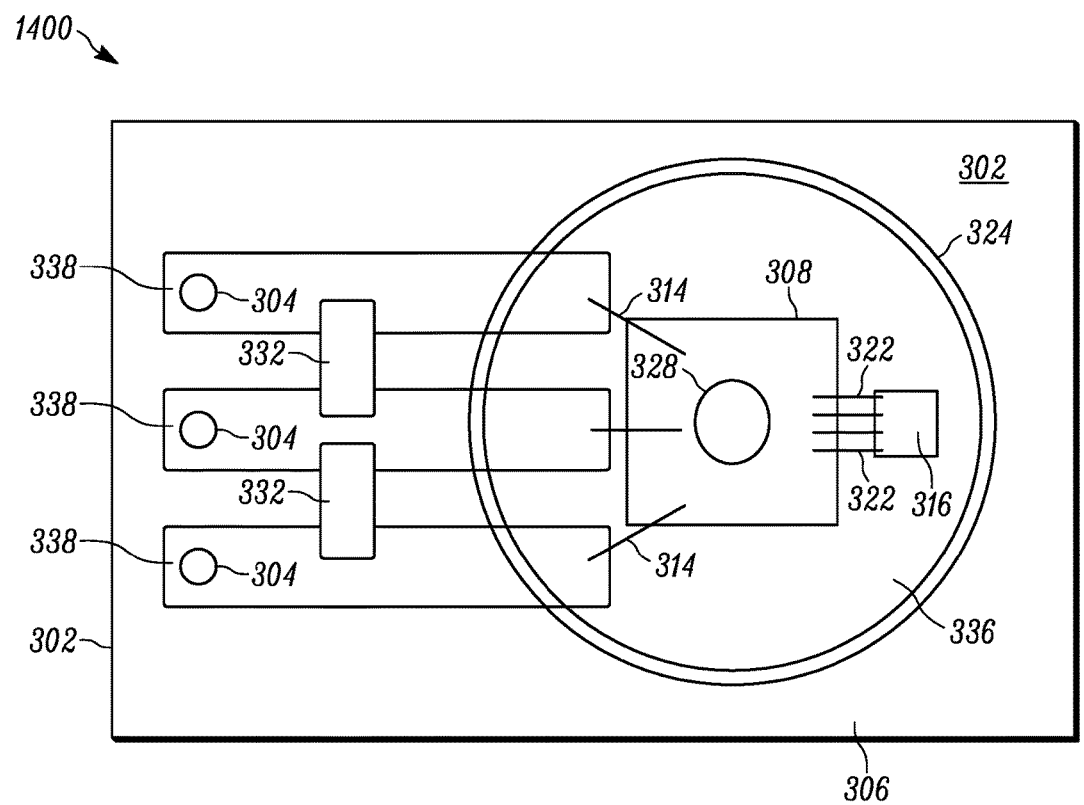
FIG. 15 is a top view of a portion of a circuit board supporting the first-level un-stacked absolute pressure sensor packaging shown in FIG. 14.

FIG. 15 is simply a top view of the first-level absolute pressure sensor packaging 1400 shown in FIG. 14. The absolute MEMS pressure sensing element 316 is laterally offset from the ASIC 308.

Figure 16:
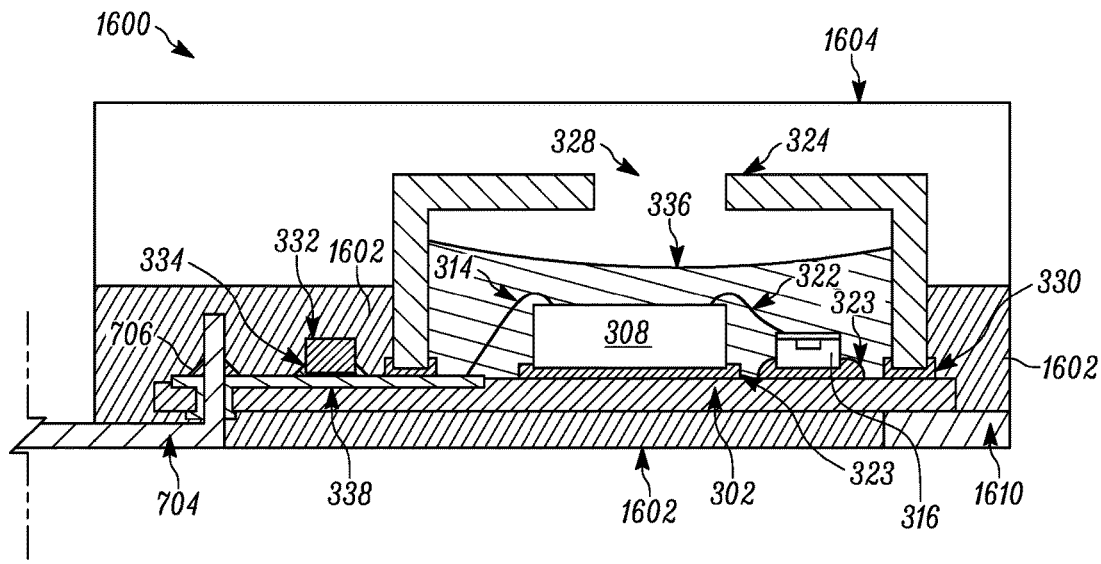
FIG. 16 is a cross-sectional view of a calibrated first-level un-stacked absolute pressure sensor packaging singulated and mounted in a pocket of a plastic housing to form an absolute pressure sensor.

FIG. 16 is a cross-sectional view of an absolute pressure sensor 1600 in the second-level packaging. The calibrated and singulated first-level absolute MEMS pressure sensor packaging 1400 shown in FIG. 14 is installed in a pre-formed plastic housing pocket 1604. The angled connector pins 704 are through the circuit board vias 304 and soldered 706 for electrical connection. The circuit board 302 is supported by the plastic stand 1610 and the connector pins 704. The epoxy 1602 maintains the registration (location) of the angled connector pins 704, the first-level absolute MEMS pressure sensor packaging 1400 inside a shortened and simplified plastic housing (not shown), an example of which is shown in FIG. 1 and identified by reference numeral 102 but with a longer portion to accommodate the chip capacitors 120 in a well. The absolute pressure sensor 1400 in FIG. 16 is similar to the absolute pressure sensor 700 in FIG. 7 but the absolute pressure sensor 700 with the absolute MEMS pressure sensing element 316 stacked on the ASIC 308 is a preferred embodiment with reduced packaging size and lower cost subjected to a smaller cap, lower gel volume, and smaller pocket and smaller pre-formed plastic housing.

Figure 17:
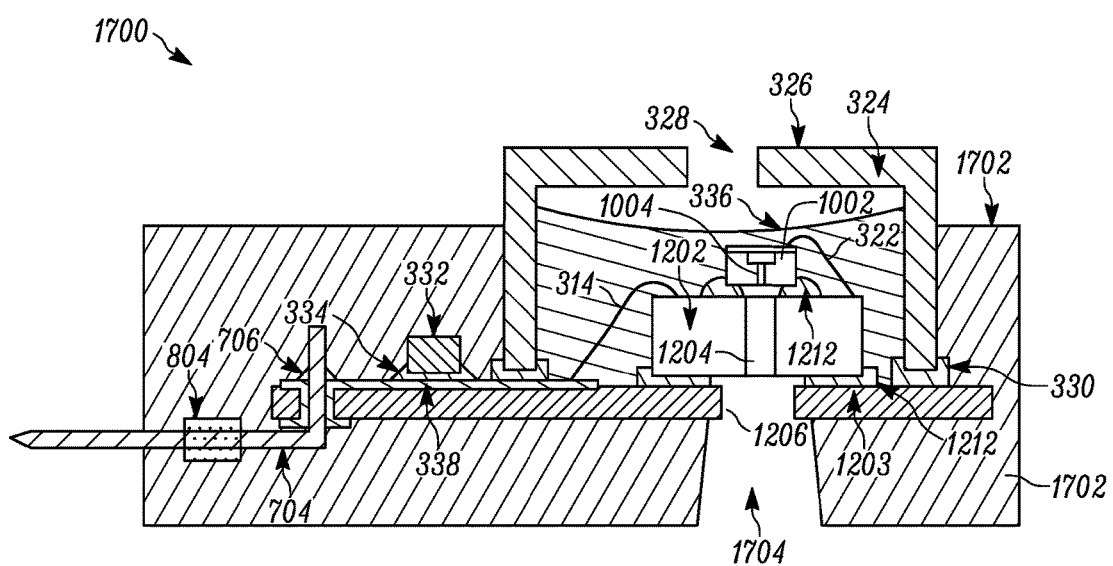
FIG. 17 is a cross-sectional view of another alternate embodiment of an overmolded stacked differential pressure sensor.

FIG. 17 is a cross-sectional view of an embodiment of a differential pressure sensor in a second-level packaging 1700 by overmolding a calibrated first-level differential MEMS pressure sensor packaging 1200 with the port 1206 as shown in FIG. 12 and pre-molded connector pins 704. The first-level differential MEMS pressure sensor packaging 1200 is singulated from a larger circuit board (not shown) similar to the circuit board 500 in FIG. 5. Note that the circuit board 500 is to accommodate multiple first-level absolute MEMS pressure sensor packagings 300 instead of the first-level differential MEMS pressure sensor packagings 1200. A formed overmold 1702 has a port 1704 in the bottom side to allow the media to enter from the bottom side through the hole 1206 of the circuit board 1203, the hole 1204 of the ASIC 1202, and the hole 1004 of the differential MEMS pressure sensing element 1002 to reach the bottom side of the diaphragm to resist the pressure form the top side of the diaphragm for differential pressure sensing. More particularly, overmold 1702 does not extend over the cap's top surface 326. The angled connector pins 704 are electrically connected to the via 304 of the circuit board 1203 of the calibrated first-level differential MEMS pressure sensor packaging 1200 to form a differential pressure sensor in a second-level packaging without a pre-formed plastic housing.

Figure 18:
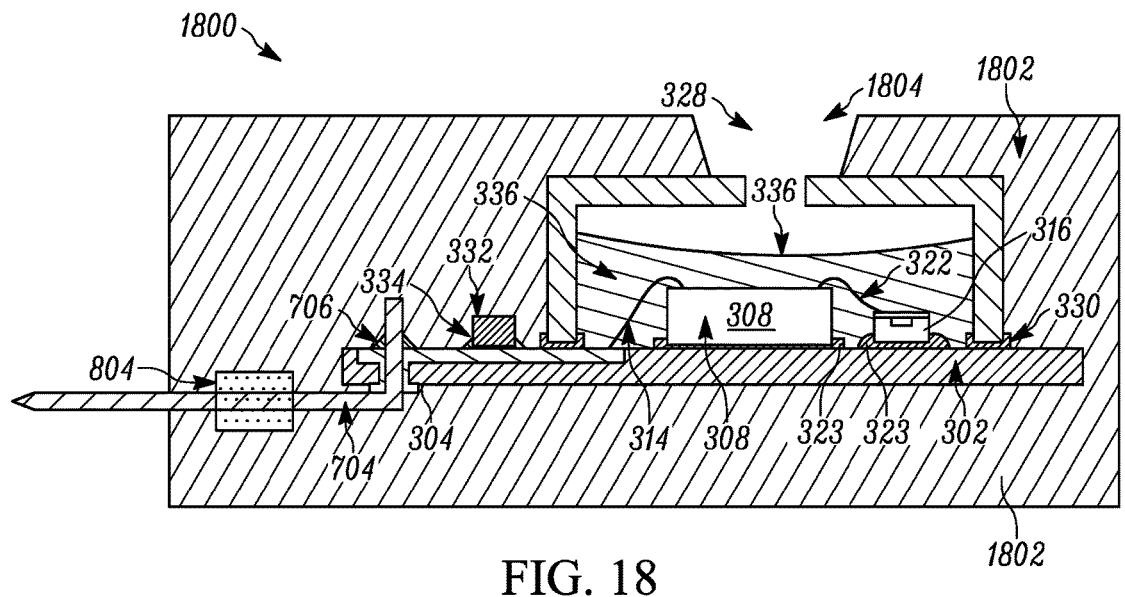
FIG. 18 is an alternate embodiment of an overmolded un-stacked absolute pressure sensor.

FIG. 18 is a cross-sectional view of an alternate embodiment of an absolute pressure sensor 900 in a second-level packaging. The embodiment 1800 shown in FIG. 18 is similar to that shown in FIG. 9 except that the embodiment 900 in FIG. 9 has the absolute MEMS pressure sensing element 316 stacked on the ASIC 308 and the embodiment in FIG. 18 has an absolute MEMS pressure sensing element 316 placed adjacent to an ASIC 308. FIG. 9 shows a preferred embodiment due to smaller packaging size with the absolute MEMS pressure sensing element 316 stacked on the ASIC 308.

Figure 19:
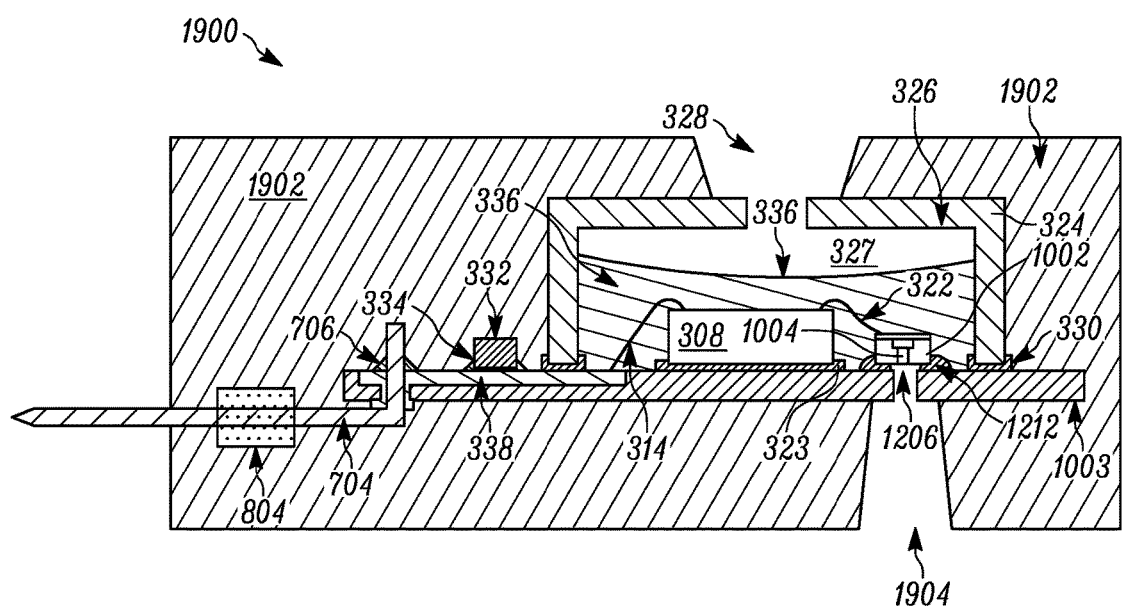
FIG. 19 is yet another alternate embodiment of an overmolded un-stacked differential pressure sensor.

FIG. 19 depicts an alternate embodiment of the differential pressure sensor by connecting the first-level differential MEMS pressure sensor packaging 1000 shown in FIG. 10 to pre-molded connector pins 704 and soldered the pins 704 through the vias 304 and overmolding them together to form a differential pressure sensor 1900 in the second level packaging. More particularly, FIG. 19 depicts the differential pressure sensor of FIG. 10, embedded in a plastic overmold 1902 that covers most of the top 326 of the cap 324 but which does not cover the orifice 328. Similarly, a hole 1904 is formed in the bottom of the overmold 1902 which is aligned with the hole 1206 through the circuit board 1003.

Figure 20:
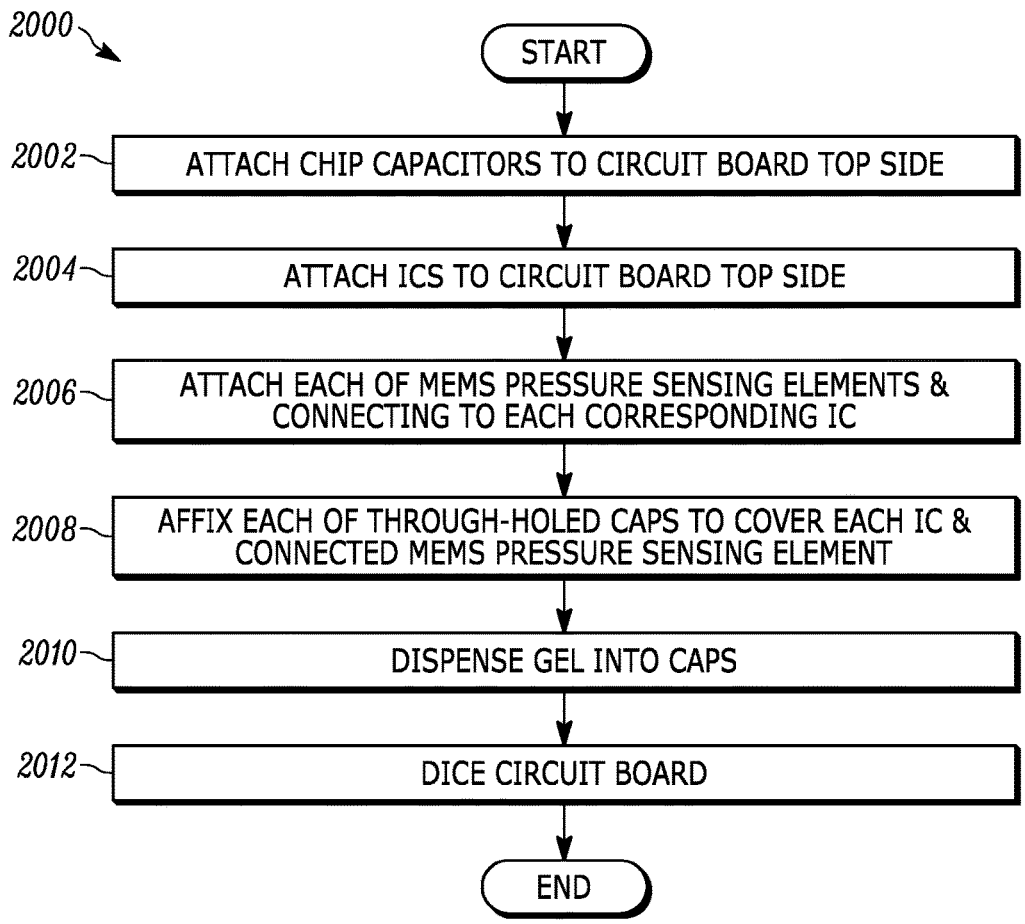
FIG. 20 is a method of forming MEMS pressure sensors.

FIG. 20 depicts steps of a method 2000 of forming a plurality of MEMS pressure sensors on a circuit board. At a first step 2002, several chip capacitors are attached to the top side of a circuit board outside the locations of caps that are fixed to the top side of the circuit board later. At step 2004, several integrated circuits are located on the top side of the circuit board with each integrated circuit having its bottom side attached to the circuit board with a small dollop of adhesive such as silicone.

At step 2006, a MEMS pressure sensing element is attached. In some embodiments, step 2006 requires an absolute MEMS sensing element to be attached to the top side of each integrated circuit to form stacked MEMS pressure sensing elements and integrated circuits. In other embodiments, an absolute MEMS pressure sensing element is attached to the circuit board. In yet other embodiments, differential pressure sensing elements are attached to either an IC with a through hole or to a circuit board having a through hole.

After the MEMS pressure sensing elements are attached, bond wires are placed to connect the MEMS pressure sensing elements to the integrated circuits. Other bond wires are used to attach the integrated circuit to electrical contacts on the circuit boards. Each integrated circuit is thus connected to metal traces on the circuit board with those bond wires.

After the integrated circuits and the MEMS pressure sensors are placed and after the bond wires are bonded, at step 2008, a cap is affixed over the integrated circuit and MEMS pressure sensing element. As described above, the cap comprises preferably a hollow cylinder having an open end and a top end that is closed except for a small through-hole or orifice.

At step 2010, gel is inserted through the opening in the top surface of the cap which encapsulates the electrical components inside the cap. After the caps are attached and the gel inserted, the circuit board is diced to form several individual first-level pressure sensor packages at step 2012.

Those of ordinary skill in the art should appreciate that the enclosure of the critical electrical components of a MEMS pressure sensor packaging with a cap to confine the gel and reduce the amount of gel to encapsulate those electrical components. While a preferred embodiment of the cap is metal, alternate embodiments use caps made of ceramic, silicon or glass.

The foregoing description is for purposes of illustration only. The true scope of the invention is set forth in the following claims.

What is claimed is:

1. A pressure sensor comprising:
    a circuit board having upper and lower surfaces and a plurality of vias for electrical connection;
    an integrated circuit having upper and lower surfaces, the lower surface of the integrated circuit being attached to the circuit board's upper surface;
    a first plurality of bond wires, electrically connecting the integrated circuit to the circuit board;
    a MEMS pressure sensing element having a top side and a back side, the MEMS pressure sensing element's top side having a diaphragm;
    a second plurality of bond wires electrically connecting the MEMS pressure sensing element to the integrated circuit;
    a cap attached to the upper surface of the circuit board and enclosing the integrated circuit, the MEMS pressure sensing element and the bond wires therein, the cap having a top surface with an orifice;
    a plurality of chip capacitors mounted on the circuit board outside of the cap; and
    a gel inside the cap and substantially covering: the integrated circuit, the MEMS pressure sensing element, the first plurality and the second plurality of bond wires;
        wherein pressure outside the cap is applied to the diaphragm via the gel through the orifice.

2. The pressure sensor of claim 1, wherein the MEMS pressure sensing element has a vacuum cavity and wherein the MEMS pressure sensing element backside is attached to the upper surface of the integrated circuit thereby forming a stacked absolute pressure sensor.

3. The pressure sensor of claim 2, further comprising:
    a first layer of adhesive located between the integrated circuit and the circuit board's upper surface; and
    a second layer of adhesive located between the integrated circuit's upper surface and the backside of the MEMS pressure sensing element.

4. The pressure sensor of claim 1, wherein the MEMS pressure sensing element has a vacuum cavity below the diaphragm and wherein the MEMS pressure sensing element backside is attached to the upper surface of the circuit board and adjacent to the integrated circuit thereby forming an un-stacked absolute pressure sensor.

5. The pressure sensor of claim 4, further comprising:
    a first layer of adhesive located between the integrated circuit and the circuit board's upper surface; and
    a second layer of adhesive located between the circuit board's upper surface and the backside of the MEMS pressure sensing element.

6. The pressure sensor of claim 1, wherein the cap comprises a hollow cylinder having first and second opposing ends, the first end being open, the second end being closed by a substantially round flat plate having first and second opposing surfaces and a hole that extends through the plate.

7. The pressure sensor of claim 1, wherein the cap is attached to the upper surface of the circuit board by at least one of epoxy and solder.

8. The pressure sensor of claim 1, wherein the cap is made of metal.

9. The pressure sensor of claim 1, wherein the cap is made of ceramic.

10. The pressure sensor of claim 1, wherein the cap is made of silicon.

11. The pressure sensor of claim 1, wherein the cap is made of glass.

12. The pressure sensor of claim 1, further comprising:
    an injection-molded housing having a pocket that accommodates the circuit board;
    a plurality of angled pins embedded in the housing with angled segments extending through the vias of the circuit board and soldered to the circuit board for electrical connections;

wherein the cap is partially embedded in a layer of epoxy, the epoxy being used to constrain movement of the circuit board and protect the chip capacitors and the solders.

13. The pressure sensor of claim 1, further comprising:
pre-molded angled pins having an angled segments extending through the circuit board vias and soldered to the circuit board for electrical connections;
a plastic overmold encapsulating the circuit board, the chip capacitors, portion of the angled pins, and the cap;
wherein the cap is partially embedded in the plastic overmold.

14. The pressure sensor of claim 13, wherein the cap and the cap's top surface, but not the orifice, are embedded in the plastic overmold.

15. The pressure sensor of claim 1, wherein the integrated circuit has a hole, the circuit board has a hole and wherein the MEMS pressure sensing element has a hole in the backside of the MEMS pressure sensing element that extends upwardly through the MEMS pressure sensing element to the diaphragm, the MEMS pressure sensing element being stacked on top of the integrated circuit with the backside of the MEMS pressure sensing element facing the upper surface of the integrated circuit, the holes in the integrated circuit, circuit board and MEMS pressure sensing element being aligned with each other to form a stacked differential pressure sensor, such that the diaphragm in the MEMS pressure sensing element deflects responsive to a first pressure applied through the orifice in the cap and a second pressure applied through the holes in the circuit board, integrated circuit and MEMS pressure sensing element.

16. The pressure sensor of claim 15, further comprising:
a first layer of adhesive located between the integrated circuit and the circuit board's upper surface; and
a second layer of adhesive located between the integrated circuit's upper surface and the backside of the MEMS pressure sensing element.

17. The pressure sensor of claim 1, wherein the circuit board further comprises a hole adjacent to the integrated circuit and which extends through the upper and lower surfaces of the circuit board, wherein the MEMS pressure sensing element is a differential pressure sensing element further comprising a hole in its back side that extends upwardly to the diaphragm, the hole in the back side of the MEMS pressure sensing element being aligned with the hole through the upper and lower surfaces of the circuit board to form an un-stacked differential pressure sensor, wherein
a first pressure is applied to the top side of the diaphragm through the orifice in the cap and through the gel and,
a second pressure is applied to the back side of the diaphragm through the hole in the circuit board and the hole in the back side of the MEMS pressure sensing element.

18. The pressure sensor of claim 17, further comprising:
a first layer of adhesive located between the circuit board's upper surface and the integrated circuit's lower surface; and
a second layer of adhesive located between the circuit board's upper surface and the MEMS pressure sensing element's back side.

19. A method of forming a plurality of MEMS pressure sensors, the method comprising:

attaching a plurality of chip capacitors on a top side of a circuit board outside of locations of caps, which will be affixed thereafter;

attaching a plurality of integrated circuits on the top side of the circuit board, each integrated circuit having a top side and a bottom side, the bottom side of each integrated circuit being attached to the top side of the circuit board;

attaching each of a plurality of MEMS pressure sensing elements on the top side of at least one of the corresponding integrated circuit and the circuit board, each MEMS pressure sensing element having a diaphragm on a top side;

connecting each MEMS pressure sensing element to the integrated circuit with a first plurality of bond wires;

connecting each integrated circuit to corresponding metal traces on the circuit board with a second plurality of bond wires;

affixing a cap over each integrated circuit and MEMS pressure sensing element, the cap comprising a hollow cylinder having first and second ends and an open interior, the first end being open and located against the circuit board top surface, the second end being closed by a substantially flat plate having a through hole;

inserting a gel into the cap through the through hole to substantially cover: the MEMS pressure sensing element and integrated circuit, and the first plurality and the second plurality of bond wires; and dicing the circuit board between each affixed cap to form a plurality of individual MEMS pressure sensors.

20. The method of claim 19, wherein each MEMS pressure sensing element having a vacuum cavity below the diaphragm is attached to the top side of the corresponding integrated circuit to form a plurality of stacked absolute pressure sensors.

21. The method of claim 19, wherein each MEMS pressure sensing element having a vacuum cavity below the diaphragm is placed on the top side of the circuit board and adjacent to the corresponding integrated circuit to form a plurality of un-stacked absolute pressure sensors.

22. The method of claim 19, wherein each MEMS pressure sensing element having a hole in a lower surface with the hole extending upwardly through the MEMS pressure sensing element to the diaphragm is placed and aligned on the top side of the corresponding integrated circuit having a through hole, and each integrated circuit being aligned over a corresponding through hole formed in the circuit board to form a plurality of stacked differential pressure sensors.

23. The method of claim 19, wherein each MEMS pressure sensing element having a hole in a lower surface with the hole extending upwardly through the MEMS pressure sensing element to the diaphragm is placed and aligned on the top side of the circuit board and adjacent to the corresponding integrated circuit, each MEMS pressure sensing element being aligned over a corresponding through hole formed in the circuit board to form a plurality of un-stacked differential pressure sensors.

* * * * *